United States Patent [19]

Gailland

[11] 4,219,143
[45] Aug. 26, 1980

[54] METHOD FOR FORMING CONNECTIONS OF A SEMICONDUCTOR DEVICE ON BASE

[75] Inventor: Gilbert Gailland, Paris, France

[73] Assignee: Thomson-CSF, Paris, France

[21] Appl. No.: 971,092

[22] Filed: Dec. 19, 1978

[30] Foreign Application Priority Data

Dec. 20, 1977 [FR] France .................................. 77 38394

[51] Int. Cl.³ .......................................... H01L 21/60
[52] U.S. Cl. .................................. 228/159; 228/4.5
[58] Field of Search ................... 228/179, 180 A, 4.5, 228/44.1 A, 115, 160, 159; 219/56.21, 56.22

[56] References Cited

U.S. PATENT DOCUMENTS

| | | | |
|---|---|---|---|
| 3,305,157 | 2/1967 | Pennings | 228/4.5 X |
| 3,623,649 | 11/1971 | Keisling | 228/4.5 X |
| 3,643,321 | 2/1972 | Field et al. | 228/179 |

Primary Examiner—Milton S. Mehr
Assistant Examiner—K. J. Ramsey
Attorney, Agent, or Firm—Cushman, Darby & Cushman

[57] ABSTRACT

Method for welding fine wires to connecting terminations born by the base of a semiconductor device, using a tool for welding and cutting the wire in the form of a tube (9) which acts by its end face (11) containing the wire (12) to be welded, of which the outer strand (13) is to be welded to the termination (6), an incipient rupture (16) being formed by the inner angle (17) of the tube, and a limited flattening (H) being obtained by contact (40) between part of the end face of the tube and the termination, the value (H) being determined by the choice of an angle (P) created between the termination (6) and the end face (11) of the tube.

5 Claims, 11 Drawing Figures

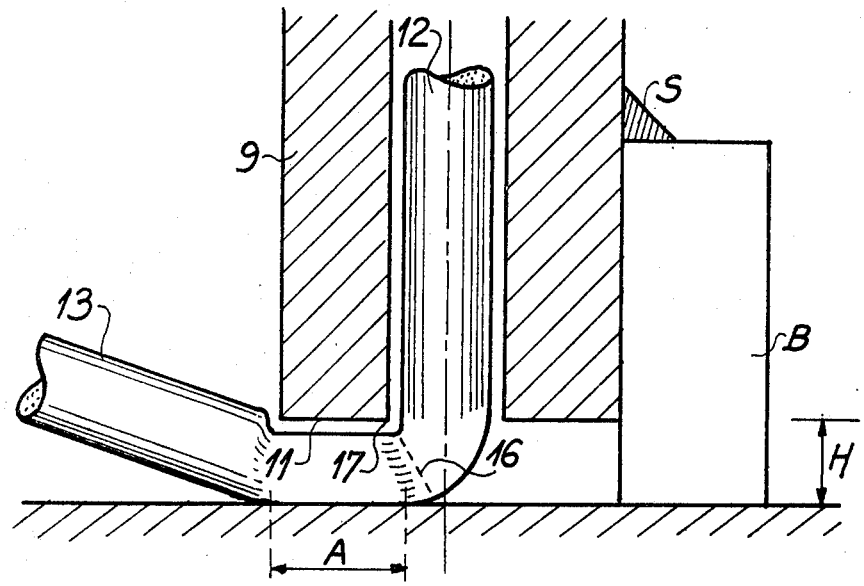
Fig_3 PRIOR ART
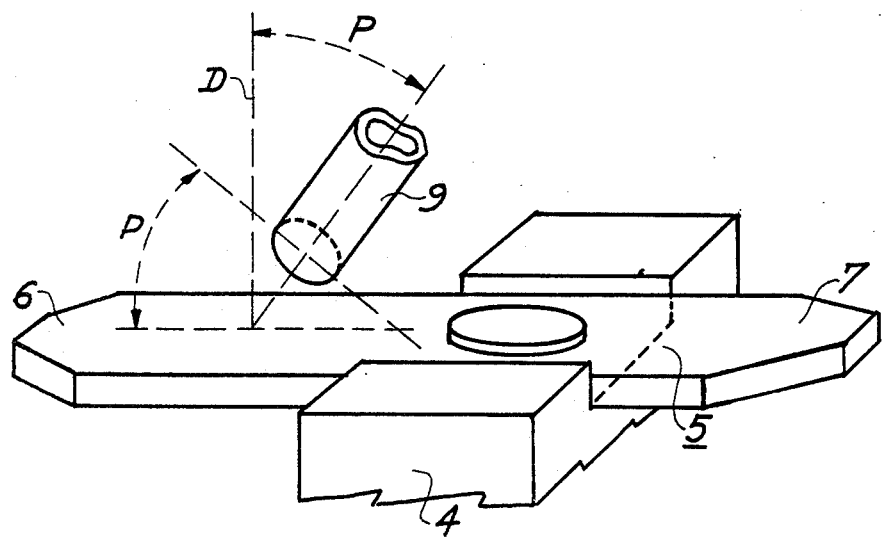
Fig_5

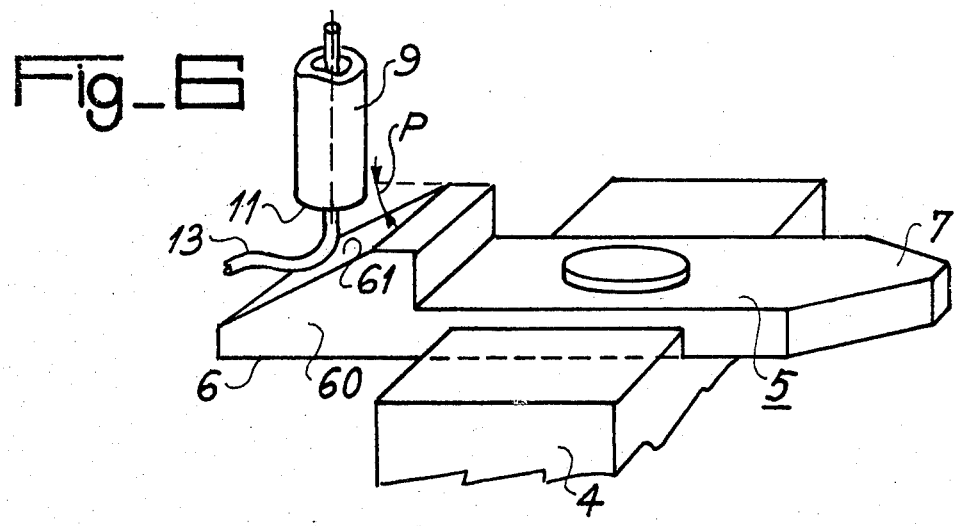
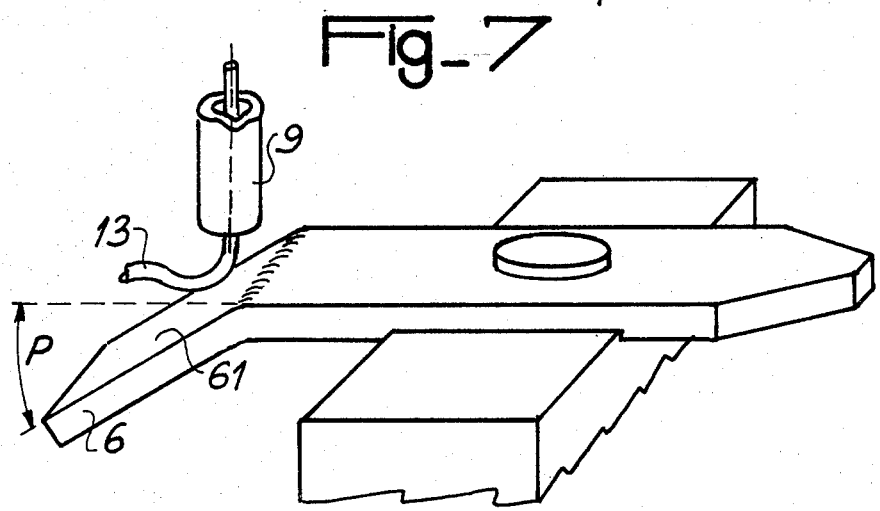
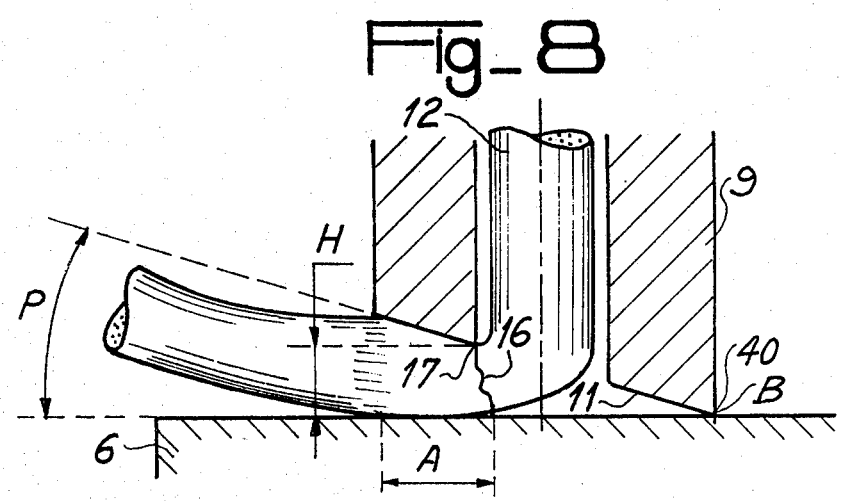

METHOD FOR FORMING CONNECTIONS OF A SEMICONDUCTOR DEVICE ON BASE

This invention relates to the welding of electrical connecting wires to metallic terminals.

In a certain number of electrical devices or apparatus, the electrodes of the active part of these devices have to be connected to conductive terminals which are supported by an insulating support or base and which, by virtue of their shape, their dimensions and their robustness, provide for easy connection to external circuits. Each terminal thus has an outer part for establishing this connection and an inner part designed to be connected to one of the electrodes of the device fixed to the base. This connection is frequently established by means of a flexible conductive wire, the inner part of the terminal having a flat part or "termination," to which the wire is applied and normally welded by one of its ends.

However, the use of a connecting means such as this, which is easy in the general case of electrical circuits of normal dimensions, becomes increasingly more difficult when the dimensions of the elements to be connected decrease, in particular in cases where the devices to be connected are on the scale of microelectronic circuits which, in addition, are often formed on a single block of semiconductor material.

In that case, the elements to be connected are generally assembled on an insulating support or base supporting the block of semiconductor material, the base and the block of semiconductor material being respectively provided around their circumferences with termination type terminals and contact electrodes connected to the various parts of the circuit existing on the block.

The conductive wire is continuously delivered to the end of a tubular guide into which it is introduced and from which it issues at one useful end. At the outlet end of the tube, the strand of wire thus exposed is alternately applied at a predetermined temperature and pressure to the terminations and to the contact electrodes where it is fixed by welding and, after each application, is cut to enable the following connecting operation to be carried out. For cutting the wire, use is made of the partial flattening which the wire undergoes in the welding zone which considerably reduces its mechanical resistance. Accordingly, a moderate tractive force applied to the strand of wire present in the guide tube is sufficient to break the wire at the actual level of the welding point.

However, as will be explained in detail hereinafter with reference to the accompanying drawings, a process such as this requires that the force with which the wire is applied to the termination, which determines both the satisfactory completion of the weld and the partial flattening of the wire, be regulated with a high degree of precision. Accordingly, it is necessary to use a high-precision device for controlling the movements of the guide tube to ensure that, at the outlet end of the tube, the wire undergoes predetermined flattening in accordance with the requirements mentioned above. Now, the connecting wire used has a very small diameter, typically of the order of 20 to 50μ, whilst the wire guide tube, of which the exit face is used for welding, typically has an external diameter of 200μ. For this reason, it is often referred to as a "capillary tube". The distance to be established between the exit face of the tube and the surface of the termination is therefore very small, typically of the order of half the diameter of the wire, i.e. approximately 10 to 30μ.

In practice, the wire itself forms the sole spacing wedge defining the distance to be established when it reaches its final thickness after flattening. Under these conditions, the definition of the corresponding distance is very imprecise because, for a constant application force, it depends upon the diameter of the wire and upon the nature of its constituent material. In contrast to conventional welding processes developed on this principle, the process according to the present invention does not have any of these disadvantages.

In the method according to the invention, the final welding and breaking distance between the exit face of the wire and the termination on which the welding operation is carried out, is defined independently of any role of the wire to be welded. This distance is even defined in the absence of the wire.

More precisely, the present invention relates to a method for forming connections between a semiconductor device and a base, each of these connections being established by a wire of which one end is connected to the device whilst its other end is to be welded to a termination forming part of a contact element integral with the base, this wire being previously introduced into a tool in the form of an open tube or "capillary" from which it emerges at one end to form, on the one hand, an inner strand accommodated in the capillary and, on the other hand, an outer strand of which the direction is defined by the connection between said end and the semiconductor device, said method comprising the following steps:

guiding the wire by displacement of the end face on the welding zone of the surface of the termination, welding the wire in this zone by clamping it under heat between this zone and a portion of the end face, partial notching by limited flattening of the inner strand of the wire in the vicinity of the weld, cutting the wire by the application of a tractive force to the inner strand, this process being characterised in that flattening is limited by the fact that another portion of said end face and the surface of the termination come into contact during the notching step.

The invention will be better understood from the following description in conjunction with the accompanying drawings, wherein:

FIG. 1, in the form of an explanatory drawing, shows the known structure of an encapsulation device with connections of known type.

FIGS. 2(a), 2(b) and 2(c) shows the steps involved in welding a connection to a termination of such a device.

FIG. 3 shows a known method of carrying out a welding method.

FIGS. 4(a) and 4(b), in the form of an explanatory drawing, show a first method of carrying out the process according to the invention.

FIG. 5 shows a variant of this first method.

FIGS. 6 and 7 show embodiments of sockets suitable for carrying out the invention.

FIG. 8 shows one embodiment of a capillary tube suitable for carrying out the invention.

Figure 1:
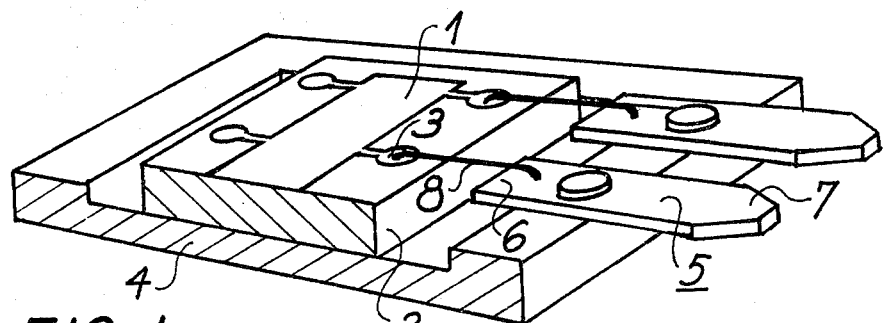

FIG. 1, in the form of an explanatory drawing, shows the known structure of an encapsulation device for a microelectronic circuit.

The circuit 1, formed on a semiconductor block 2, is fixed to a base 4 made of an insulating material and comprises a plurality of output electrodes, such as 3.

The base itself supports a plurality of terminals, such as 5, each of which comprises an inner part 6 or "termination" and an outer part 7 or connecting tag.

A conductive wire, of which the diameter and constituent material are selected to provide for high flexibility, establishes the electrical connection between each electrode 3 and the corresponding terminal 6. The circuit itself is thus protected from the mechanical stresses applied to the connections from outside, a cover (not shown) subsequently being fixed to the base to provide protection against environmental influences.

Figure 2A:
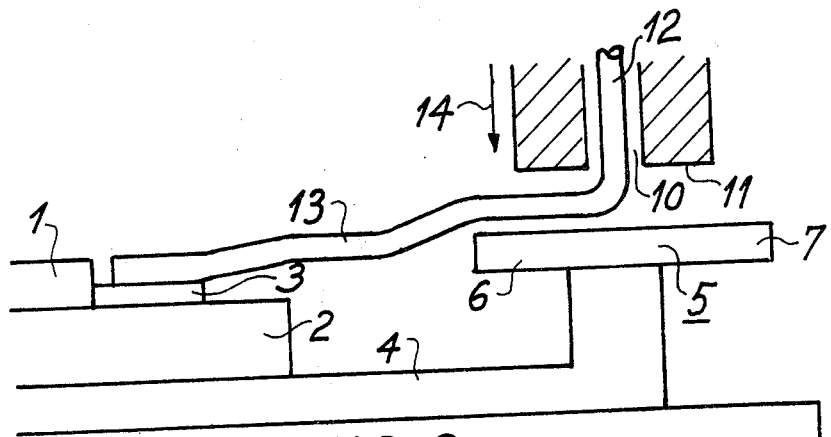

FIGS. 2(a), (b) and (c), respectively show three steps involved in the connection of a semiconductor circuit to the terminal of a base. The same elements are denoted by the same reference numerals as in FIG. 1. The known method uses a tube 9, having an inner passage 10 and an end face 11 of which the role is fundamental. In view of its very small dimensions, typically an internal diameter of 70 micrometers, this tube will be referred to hereinafter as a "capillary tube."

The connecting wire is continuously introduced into the passage, where it forms the inner feed strand 12, and issues at the end face from which it extends outwards and forms the outer connecting strand 13.

This strand having been welded to the electrode 3 beforehand, the process comprises a first welding step in which the capillary tube 9 is displaced by a mechanism (not shown) in the direction of the arrow 14, its end face parallel to the surface of the termination, thus approaching the termination to form a clamp for the wire 13 of the parallel jaw type.

This clamping operation takes place under heat and pressure under known conditions in such a way that, taking into account the type of materials used for the wire and the termination, the wire is welded to the termination over a length A. According to typical values, a temperature of 350° C. and a force of 80 gr are satisfactory for a wire 25μ in diameter and a termination 300μ in length.

Figure 2B:
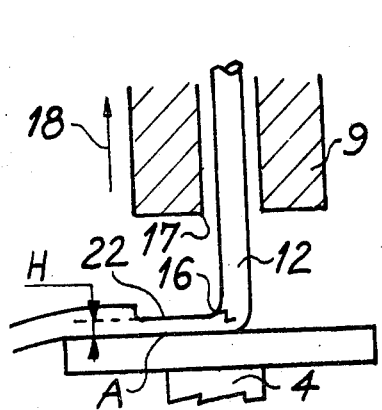

On completion of welding, the wire is left with a flattened portion 22 of constant thickness H over its entire welded length, as shown in FIG. 2(b).

However, a second result is obtained by continuing the movement of the capillary tube in the direction of the arrow 14. For a suitable value of the movement, the constituent metal of the wire is flattened beyond its ductility limits and an incipient rupture or break is advantageously produced by the end face of the capillary tube in a region 16 adjacent the inner strand 12.

In a second step, the capillary tube 9 is removed in the direction of the arrow 18 from the surface of the termination, exposing a given length of the inner strand 12.

Figure 2C:
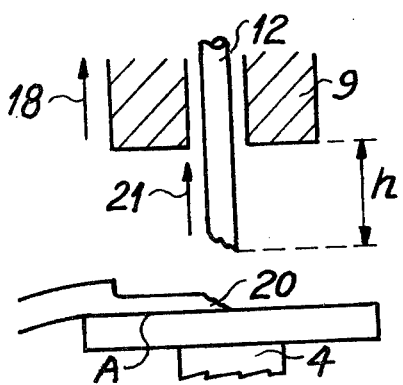

When this length reaches a value considered as adequate h, a tractive force is applied in the same direction 21 to the wire 12 and, due to the presence of the incipient rupture 16, the wire is broken at 20, as shown in FIG. 2(c).

The length h of wire now becomes an outer strand for another connecting operation and the process may be repeated with another sequence of steps as just described.

On an industrial scale, it is essential for this third step, namely the exposure outside the capillary tube of a given length of the inner strand, to be carried out first, followed by breaking of the wire at the level of the incipient rupture produced on completion of the first step because, if the wire is broken before exposure or if it is exposed without breaking, the outer strand will ultimately disappear, with the result that another length of wire will have to be taken from the delivery spool and introduced into the passage of the capillary. This so-called "loss of wire" gives rise to considerable losses of time and, hence, money in production.

Now, the satisfactory completion of the third step depends upon the mechanical resistance of the wire after flattening which in turn depends upon the residual distance left between, on the one hand, the end face of the capillary tube and, on the other hand, the surface of the termination during clamping of the wire to form the incipient rupture. In order to regulate this distance, the known process described above relies solely on the presence of the wire and, more precisely, upon the extent to which it is flattened during the welding step.

Now, there is no practical correlation between these two factors and, in the machines in which the method is carried out, the need to obtain a weld of high quality leads to applied pressures and, hence, to flattening of the wire, often giving rise to premature breaking of the wire before formation of another outer strand, the troublesome consequences of this premature breaking having been explained above.

FIG. 3 is a section through a capillary tube equipped with means for establishing an optimal clamping distance which is sufficient ot determine an incipient rupture in the breakage zone, but insufficient ot cause premature breakage before the complete formation of the outer strand, the importance of this requirement having been explained above.

This means consists of a block B which forms a stop joined to the capillary tube by a means, such as the weld S, and projecting by a distance H in relation to the end face thereof.

During the second step, this stop is applied to the surface of the termination, leaving between the surface of the termination and the end face of the capillary tube parallel thereto a clamping distance H which satisfies the requirements explained above. This distance and, hence, the distance by which the stop B has to project can only be experimentally determined because numerous factors are involved, such as the diameter of the wire, the constituent material of the wire, its physicochemical state, such as its strain hardening, its temperature, the mechanical resistance of the weld produced in the preceding step and the actual surface area of the end face.

However, a solution such as this, which may be used for a scale of dimensions of the order normally encountered in industry, becomes impracticable on a microelectronic scale where the distance H is typically of the order of 10μ micrometers.

Figure 4A:
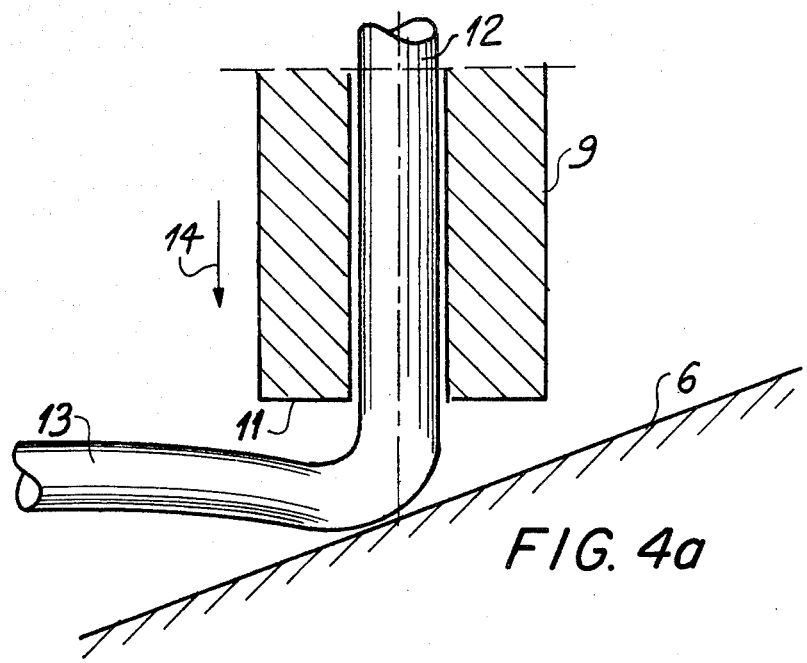
Figure 4B:
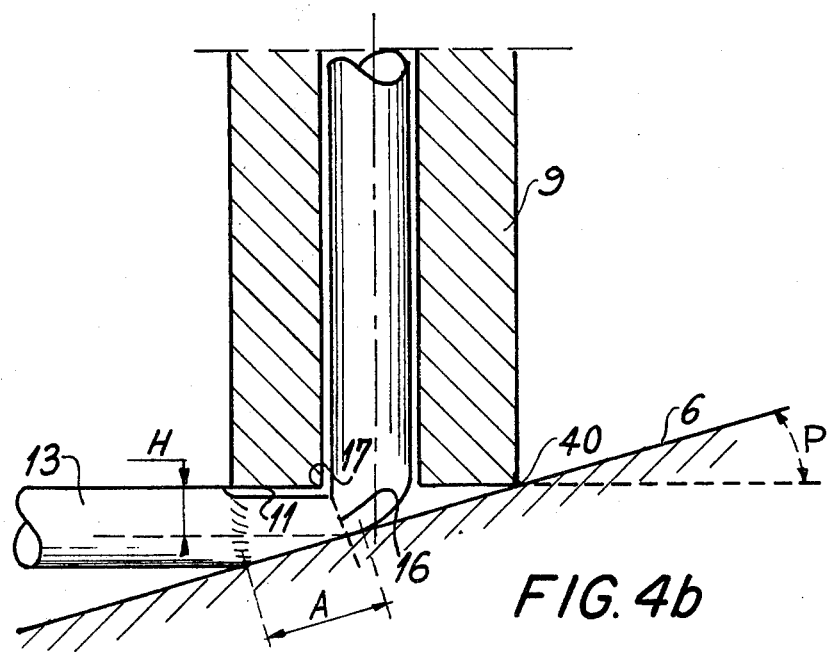

FIG. 4, in the form of an explanatory drawing, shows one method of carrying out the process according to the invention.

In this method and in other methods which will be described hereinafter, the second step described above comprises the use of simple means for applying the capillary tube to the surface of the termination, these means being perfectly adapted to the microelectronic scale and having no effect upon the nature or succession of the preceding steps.

The means illustrated in FIG. 4 establishes the required contact by establishing an angle different from zero between the clamping faces respectively formed by the end of the capillary tube and the termination to be welded. On completion of the welding step, the region of the end face of the capillary which is directed towards the apex of the angle comes into contact at 40 with the surface of the termination, thus performing the same function as the stop B illustrated in FIG. 3, but without having any of its disadvantages and difficulties of production.

FIG. 5 shows a first way for carrying out the method according to the invention.

The base of the circuit to be welded (partly shown) carries a termination 5 to be welded in known manner. By contrast, the welding capillary 9 is inclined at an angle P relative to the straight line D perpendicular to the plane of the welding surface of the termination. This method necessitates a modification to the mechanism used to displace the capillary tube to enable it to be inclined.

FIGS. 6 and 7 show another two methods for carrying out the invention.

In these methods, the welding equipment such as already illustrated in FIG. 1 remains the same. By contrast, it is the termination themselves which bear the modifications due a to the invention.

In FIG. 6, the termination 6 has, at one of its ends to be welded, a portion 60 with an inclined plane 61 to which the wire 13 may be welded, as shown in FIG. 4, by application of the welding surface 11 of the capillary tube 9.

In FIG. 7, the termination 6 is characterised by a particularly simple arrangement, i.e. the inclined plane 61 required for carrying out the method according to the invention is formed by partly bending the end of the termination.

FIG. 8 shows another advantageous way for carrying out the method according to the invention.

The method illustrated in the preceding Figures necessitates modifications, some of which are complicated, either to the mechanical welding apparatus by providing it with additional mechanism for obtaining particular angles different from 90) between the plane of the base and the axis of the capillary tube, or to the actual terminations of the bases by providing them with geometric characteristics or structures differing from those of the terminations normally encountered in practice.

In this other method, the welding apparatus is responsible for moving the capillary tube perpendicularly of the surface of the termination to be welded under the conditions already described and known, the termination to be welded being of a known type which has not been subjected to any particular bending operation. By contrast, the end 11 of the capillary tube has undergone a machining operation to provide its end face with an angle P relative to the plane perpendicular to the direction of movement of the capillary. The stop responsible for establishing the optimal clamping distance H is thus formed in a particularly simple and advantageous manner by the region of the end face adjacent the apex B of the angle P. It is pointed out that, during the plurality of welding operations to be carried out on terminations for a microelectronic circuit support, the part B will always have to be diametrically opposite the direction defined by the strand of wire already connected to the corresponding electrode of the circuit. This orientation means that the welding apparatus has to be provided with means for rotating the capillary about its axis in dependence upon this direction.

Another advantage is afforded by the embodiment illustrated in FIG. 8 by virtue of the fact that the optimal angle of the end face of the capillary tube relative to the plane perpendicular to its axis depends upon the diameter of the wire and upon the nature of its constituent material. Now, the embodiment of the capillary tube shown in FIG. 8 enables a wide variety of wires differing in their characteristics to be welded simply by changing the corresponding capillary within a range comprising exit face angles graduated in value.

In cases where the terminations are formed by the embodiment illustrated in FIG. 6 or 7, the combination between a particular angle value of the termination and another particular value of the capillary enables the possibilities of welding wires having very different characteristics to be even further extended.

The embodiments of the welding process according to the invention described above and illustrated in the accompanying drawings have only been given by way of example. Any other embodiment comprising the fundamental characteristic of the invention, namely bringing part of the end face of the capillary tube into contact with the surface of the termination to be welded during the welding step, said contact determining a given interval between this surface and another part of the end face of the capillary tube, falls within the scope of the invention.

What is claimed is:

1. A method for forming connections for a semiconductor device mounted on a base, each of these connections being established by a wire of which one end is connected to the device whilst its other end is to be welded to a termination forming part of an electrically conductive connection element integral with the base, the termination having an upper surface including a welding zone, the wire being previously introduced into a tool in the form of an open capillary tube from which it emerges at one end face of the tube to form, on the one hand, an inner strand accommodated in the tube and, on the other hand, an outer strand, the direction of which is defined by the connection between said other end of the wire and the semiconductor device, said one end face of the capillary tube being part of a first plane, and the surface of said termination being part of a second plane, the method comprising the following steps:

guiding the wire by displacement of said one end face on said welding zone of said upper surface of said termination;

welding the wire in said zone by clamping it under heat between said zone and a portion of said end face;

displacing said one end face against said wire at said zone under heat to form a partial notch in said wire by limited flattening of the inner strand of the wire in the vicinity of said weld, said one end of said wire being displaced until another portion of said end face and said upper surface of said termination come into contact to limit the extent of said flattening such that said first and second planes form a predetermined angle greater than 0° and less than 60°, the edge defining the intersection of said planes being situated on the common region of said contact; and cutting the wire by application of a tractive force to said inner strand.

2. A method as claimed in claim 1, wherein the axis of the capillary tube and its end face are respectively perpendicular.

3. A method as claimed in claim 2, wherein the surface of the termination forms said predetermined angle with the plane of the base.

4. A method as claimed in claim 1, wherein the end face of the capillary tube and the plane perpendicular to its axis form said predetermined angle.

5. A method as claimed in claim 4, wherein the end face of the capillary tube forms said predetermined angle with the plane of the base during the notching step.

* * * * *